United States Patent [19]

Isogai

[11] Patent Number: 5,528,059
[45] Date of Patent: Jun. 18, 1996

[54] PHOTOELECTRIC CONVERSION DEVICE UTILIZING A JFET

[75] Inventor: Tadao Isogai, Yokohama, Japan

[73] Assignee: Nikon Corporation, Tokyo, Japan

[21] Appl. No.: 351,158

[22] Filed: Nov. 30, 1994

[30] Foreign Application Priority Data

Dec. 1, 1993 [JP] Japan .................... 5-301666

[51] Int. Cl.[6] .................... H01L 29/80; H01L 31/112
[52] U.S. Cl. .................... 257/187; 257/257; 257/258; 257/291; 257/462; 307/117; 307/412
[58] Field of Search .................... 257/186, 187, 257/257, 258, 291, 290, 462, 438; 307/117, 412

[56] References Cited

U.S. PATENT DOCUMENTS

| | | | |
|---|---|---|---|
| 5,043,783 | 8/1991 | Matsumoto et al. | 257/257 |
| 5,155,574 | 10/1992 | Yamaguchi | 257/257 |
| 5,298,778 | 3/1994 | Yonemond | 257/257 |

FOREIGN PATENT DOCUMENTS 6021504  1/1994  Japan .................... 257/462

Primary Examiner—William Mintel
Attorney, Agent, or Firm—Keck, Mahin & Cate

[57] ABSTRACT

An amplification-type photoelectric conversion device utilizes a JFET and is capable of amplifying charges generated by photoelectric conversion with a high amplification factor and improves the S/N ratio. The device is provided with a drive circuit for respectively applying driving signals to a source region, a drain region and a gate electrode of the JFET. The drive circuit has a first signal mode for accumulating charges generated by incident light on the JFET, and a second signal mode for causing the flow of current between the source and the drain and raising a potential difference between the source and the drain to a high level thereby causing an impact-ionization effect corresponding to an amount of the charges accumulated by the first mode to accumulate the resulting charges. A signal output corresponding to a total amount of the charges accumulated by the first and second modes is delivered from the drain.

7 Claims, 2 Drawing Sheets

PHOTOELECTRIC CONVERSION DEVICE UTILIZING A JFET

BACKGROUND OF THE INVENTION

1. Field of the Invention

The present invention relates to a photoelectric conversion device and more particularly to an amplification-type photoelectric conversion device employing a field-effect transistor.

2. Related Background Art

The known semiconductor photoelectric conversion devices are broadly divided into two types. They are as follows:

a) The type in which the charges generated by incident light are delivered as such to the output; Photodiodes, etc., may be cited as typical examples of this type.

b) The type in which the charges generated by incident light produce secondary charges in accordance with the charge quantity thereof and the secondary charges are delivered to the output; In this type of photoelectric conversion devices, the charges generated secondarily are generally amplified as compared with the charges generated by the incident light. Here, this type of photoelectric conversion device is referred to as an "amplification-type photoelectric conversion device". The amplification-type photoelectric conversion devices include for example phototransistors, static induction-type photoelectric conversion devices and photoelectric conversion devices comprising junction field-effect transistors (JFET).

The photoelectric conversion device may be used singly or alternatively a plurality of the photoelectric conversion devices may be utilized as an integrated device so as to form a plurality of picture elements arranged one-dimensionally or two-dimensionally. The latter is generally known as a line sensor or image sensor and in this case the sensor incorporates not only a plurality of photoelectric conversion devices forming a plurality of picture elements but also a charge transfer device, e.g., a CCD and wiring for delivering the signal charges produced by the photoelectric conversion to the outside, a drive circuit for applying a driving signal to each of the respective electrodes of the sensor to drive it, etc.

With the conventional amplification-type photoelectric conversion device utilizing a JFET, the drain voltage is maintained constant throughout all of the charge accumulation period, the signal read-out period and the undesired charge discharge period. On the other hand, in the case of the n-channel JFET, for example, the voltage applied to the gate electrode is maintained at a low level during the charge accumulation period so that a depletion layer is formed in the channel between the source and the drain and the current flow is cut off between the source and the drain. As a result, the holes generated by the photoelectric conversion are accumulated as signal charges and, on the other hand, the electrons are discharged to the substrate of the device. The voltage applied to the gate electrode is raised to a certain intermediary level during the signal reading period so that the depletion layer of the channel is partially extinguished. As a result, the electrons from the source pass through the channel and flow into the drain through the depletion layer in the vicinity of the drain. At this time, the resistance value of the channel assumes a value corresponding to the amount of accumulated holes and therefore the electrons passed through the channel are delivered as the amplified secondary signal charges from the drain to the output terminal. The voltage applied to the gate electrode after the signal reading period is again restored to the low level and therefore the current flow is again cut off between the source and the drain. Thereafter, the voltage applied to the gate electrode is raised to a high level so that the undesired accumulated charges (holes) are recombined with the electrons in the substrate and are lost.

Thus, the amplification-type photoelectric conversion device is capable of outputting the secondary signal charges amplified in accordance with the amount of the charges generated by the incident light and hence is capable of producing a large output signal as compared with the photoelectric conversion device, e.g., the photodiode belonging to the previously mentioned type a). However, the charge amplification factor attained by the conventional amplification-type photoelectric conversion device is still insufficient and generally an output amplifier is incorporated in the output stage of the device so as to obtain the output signal level required for the sensor. If such output amplifier is present, not only the signal component but also the noise component contained therein are amplified and therefore it is impossible to obtain any advantage with respect to the signal-to-noise ratio.

SUMMARY OF THE INVENTION

It is an object of the present invention to provide an amplification-type photoelectric conversion device which is capable of amplifying the charges generated by photoelectric conversion and improving the signal to noise ratio.

To accomplish the above object, in accordance with the basic concept of the present invention there is thus provided an amplification-type photoelectric conversion device employing a field-effect transistor. The device includes an n-type silicon semiconductor substrate, a p-type well region provided on the first principal surface side of the substrate to form a p-n junction photoelectric conversion section within the semiconductor substrate, an n-type source region formed within the well region, an n-type drain region formed within the well region, a p-type gate region formed between the source region and the drain region on the first principal surface side within the well region, an n-type channel region formed between the source region and the drain region within the well region just below the gate region, an insulating film formed on the surface of the gate region exposed on the first principal surface, a gate electrode arranged to face the gate region through the insulating film, and a drive circuit for applying driving signals to the source region, the drain region and the gate electrode, respectively.

In particular, the drive circuit has a first signal mode for accumulating the charges generated by an incident light on the photoelectric conversion section, a second signal mode for causing the flow of current between the source region and the drain region and also increasing the potential difference between the source region and the drain region to a high level thus causing an impact-ionization effect corresponding to the amount of the charges accumulated in the first signal mode and thereby accumulating the charges generated by this effect, and a third signal mode for causing the flow of current between the source region and the drain region and also lowering the potential difference between the source region and the drain region to a low level thereby delivering from the drain region the secondary charges corresponding to the total amount of the charges accumulated in the first signal mode and the charges accumulated in the second signal mode.

In accordance with a preferred aspect of the present invention, the drive circuit further includes a fourth signal mode for extinguishing all the charges accumulated in the first and second signal modes after the completion of the third signal mode.

In accordance with another preferred aspect of the present invention, the drive circuit repeatedly performs first signal mode, the second signal mode, the third signal mode and the fourth signal mode in this order.

The impact-ionization effect is also called as an avalanche effect and this is a phenomenon which occurs in the high electric field region of the Si. In the high electric field region of the Si, the charges obtain a higher energy than the band gap of the Si. The high energy charges are then bombarded against the neutral Si atoms and other charges (holes and electrons) are generated by the bombardment. The resulting other charges are further bombarded against another neutral Si atoms and thus new charges are further generated. In this way, the high energy charges are successively bombarded against the Si atoms repeatedly and a large number of new charges are generated. While such a high electric field region can be caused by the application of a high reverse bias to the p-n junction, the occurrence of a such region is also acknowledged by the application of a relatively low voltage of about 10 V. While it is generally considered that the impact-ionization in effect has such detrimental effects as the occurrence of noise and malfunction of the photoelectric conversion device, the present invention conversely utilizes this impact-ionization effect effectively.

In accordance with the present invention not only the signal charge amplification effect in the ordinary amplification-type photoelectric conversion device but also the charge amplification effect due to the impact-ionization effect are utilized with the result that a remarkably greater amplification factor is obtained and that this is not the amplification effect due to an amplifier. Thus, there the signal-to-noise ratio of the output obtained from the device is improved.

The above and other objects, features and advantages of the present invention will be more clearly understood from the following description of its embodiments shown simply for illustrative purposes without any intention of limitation when taken in conjunction with the accompanying drawings.

DESCRIPTION OF THE PREFERRED EMBODIMENTS

Figure 1:
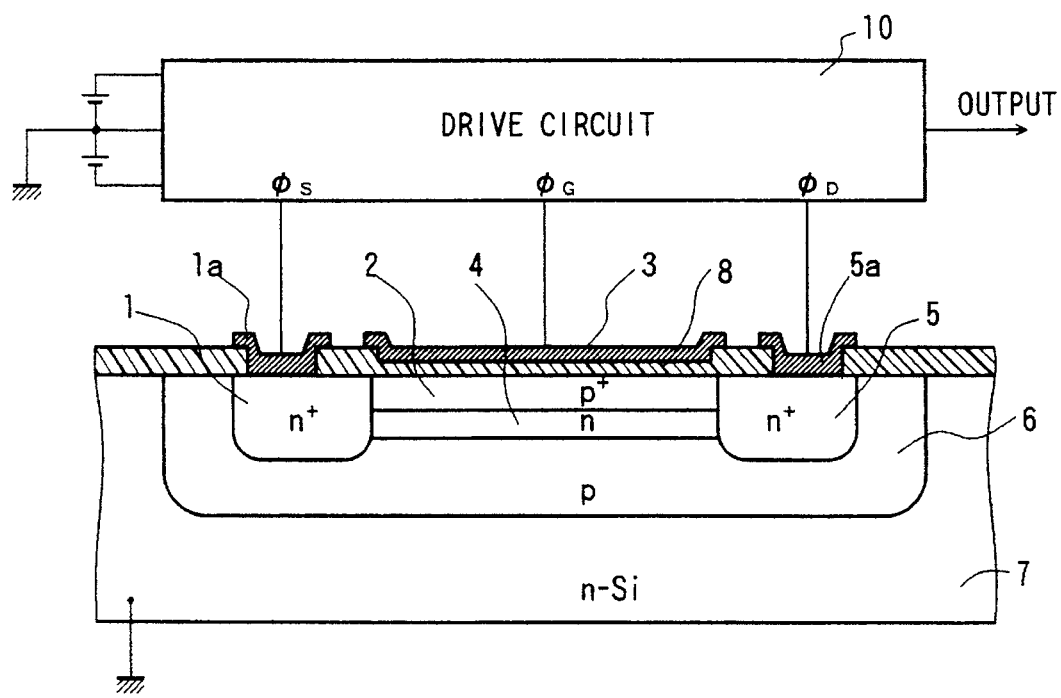
FIG. 1 shows schematically the construction of a photoelectric conversion device according to an embodiment of the present invention.

Referring to FIG. 1, the illustrated amplification-type photoelectric conversion device according to the present embodiment is constructed by utilizing an n-channel JFET. A semiconductor substrate 7 is a silicon substrate of a first conductivity type (an n-type here) having a phosphorus concentration of $1*10^{15}/cm^3$. A well region 6 of a second conductivity type (a p-type here) having boron diffused therein at a concentration of $1*10^{16}/cm^3$ is formed on the first principal surface side of the semiconductor substrate 7. A p-n junction formed by the well region 6 and the substrate 7 constitutes a photoelectric conversion section.

Formed within the well region 6 are a source region 1 and a drain region 5 of the first conductivity type (an n-type here) each having phosphorus diffused therein at a concentration of $1*10^{20}/cm^3$. In this case, the impurity diffusion concentrations of the source region 1 and the drain region 5 are generally higher than that of the semiconductor substrate 7. A source electrode 1a and a drain electrode 5a, which are made of aluminum, are respectively deposited to the surfaces of the source region 1 and the drain region 5.

In the well region 6, a channel region 4 of the first conductivity type (an n-type here) having phosphorus diffused therein at a concentration of $5*10^{16}/cm^3$ is formed between the source region 1 and the drain region 5 and also formed on the channel region 4 is a gate region 2 of the second conductivity type (a p-type here) having boron diffused therein at a concentration of $1*10^{17}/cm^3$. Thus, in this case the n-type channel region 4 is interposed between the p-type gate region 2 and the p-type well region 6, and the gate region 2 and the well region 6 are electrically connected with each other at the end positions in a direction perpendicular to the plane of the paper in FIG. 1, thereby constructing charge accumulation portions by the gate region 2 and the well region 6.

The surface of the gate region 2 is located within the first principal surface of the semiconductor substrate 7 and an insulating film 8 made of an oxide film is formed on the surface of the gate region 2. A polysilicon gate electrode 3 for controlling the potential of the gate region 2 through the insulating film 8 is formed on the insulating film 8 so as to face the gate region 2.

The source electrode 1a, the gate electrode 3 and the drain electrode 5a are connected to a drive circuit 10, and the drive circuit 10 is composed for example of a gate array or the like so that driving signals $\phi_S$, $\phi_G$ and $\phi_D$, which will be described later, are respectively applied to these electrodes and the device is sequentially driven in a first signal mode, a second signal mode, a third signal mode and a fourth signal mode, respectively.

Figure 2:
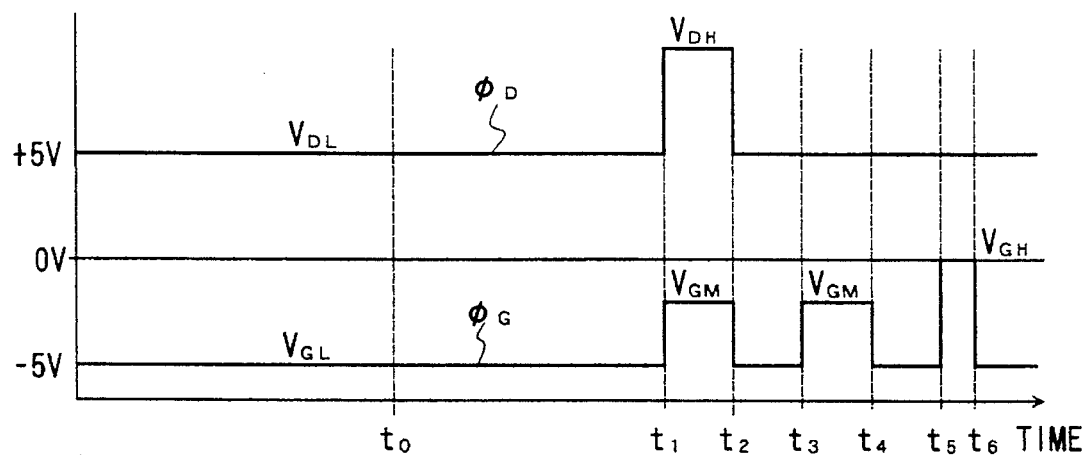
FIG. 2 shows a time chart of driving signals due to the operation of the drive circuit in the embodiment of FIG. 1.

The operation of the photoelectric conversion device according to the present embodiment will now be described with reference to FIG. 2.

=First Signal Mode=

In this mode, at a time $t_0$, the drive circuit 10 grounds the source electrode 1a and also maintains the signal $\phi_D$ applied to the drain electrode 5a at a low level $V_{DL}$ (=5V) and the signal $\phi_G$ applied to the gate electrode 3 at a low level $V_{GL}$ (=–5V). When this occurs, a depletion layer is formed in the channel region 4 and the source region 1 and the drain region 5 are electrically cut off from each other. When light falls on the photoelectric conversion section composed of the p-n junction between the substrate 7 and the well region 6, charges (holes and electrons) are generated. Of the resulting charges, the holes are accumulated within the well region 6 and the gate region 2 and the electrons are drained from the substrate 7 to the outside through wiring which is not shown. The operation due to the first signal mode is continued up to a time $t_1$ and this time period corresponds to the charge accumulation period due to the incident light.

=Second Signal Mode=

Then, during the time period from the time $t_1$ to a time $t_2$ the drive circuit 10 performs the operation according to the second signal mode. In this mode, the signal $\phi_D$ applied to the drain electrode 5a is maintained at a high level $V_{DH}$ (=10V) and the signal applied to the gate electrode 3 is maintained at an intermediate level $V_{GM}$ (=–2V).

In this case, the value of $V_{DH}$ is selected such that when the source region 1 and the drain region 5 are electrically connected to each other, a depletion layer Ld (FIG. 3) between a drain-side end 9 (FIG. 3) of the spread of the channel region 4 and the drain region 5 becomes a high electric-field region sufficient to cause an impact-ionization effect. While this value of $V_{DH}$ differs depending on the construction of the device, the manufacturing conditions, etc., in the case of the standard-type JFET, it is only necessary to determine the value in such a manner that the source-drain potential difference becomes 7V or over, preferably 10V or over.

Also, the value of $V_{GM}$ is selected in such a manner that the depletion layer in the channel region 4 disappears except for the portion near the drain.

Figure 3:
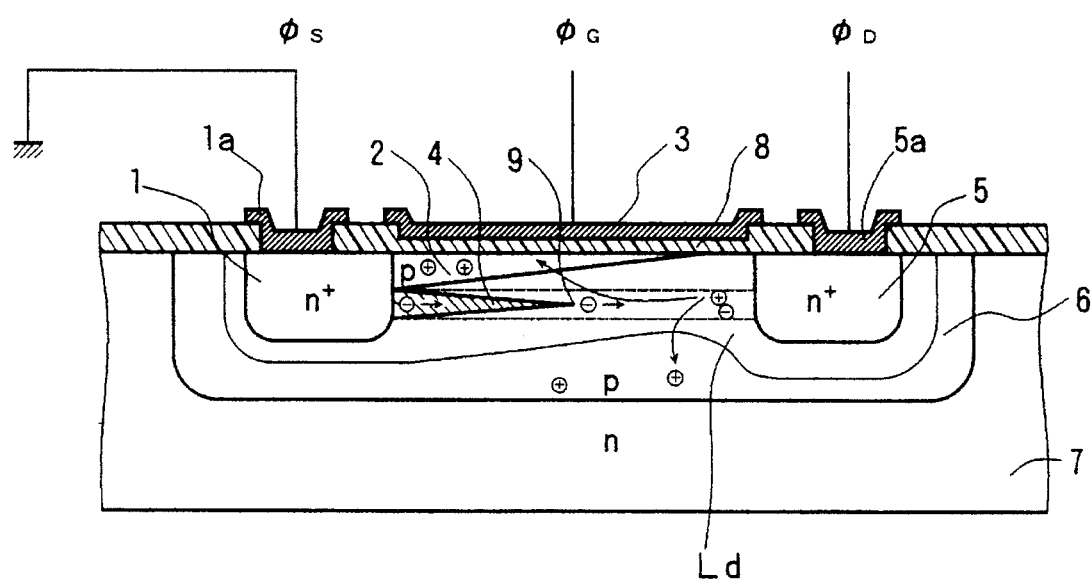
FIG. 3 shows schematically the operating principle in the second operating mode of the embodiment of FIG. 1.

In the second signal mode, the source region 1 and the drain region 5 are electrically connected to each other so that the electrons flow from the source region 1 into the drain region 5 through the channel region 4 and via the depletion layer Ld near to the drain. At this time, in the depletion layer Ld between the end 9 of the channel region 4 extending near to the drain region 5 and the drain region 5 an impact-ionization effect is caused by the electrons amplified in accordance with the amount of the charges accumulated in the gate region 2 and the well region 6 due to the first signal mode and this situation is schematically shown in FIG. 3.

Of the charges (holes and electrons) generated by the impact-ionization effect, the holes are stored in the gate region 2 and the well region 6. As a result, not only the holes produced by the photoelectric conversion but also the holes produced by the impact-ionization effect are accumulated in the gate region 2 and the well region 6, with the result that the amount of the holes accumulated in the gate region 2 is greater than the amount of the holes generated by the photoelectric conversion. It is to be noted that the electrons generated by the impact-ionization effect flow into the drain region 5 through the depletion layer Ld and are discharged to the outside from the electrode 5a due to the operation of the drive circuit in the second signal mode.

The time interval from the time $t_1$ to the time $t_2$ in the second signal mode is the time period for causing the impact-ionization effect so that when the time $t_2$ is reached, the drive circuit 10 respectively restores the signal $\phi_D$ applied to the drain electrode 5a to the low level $V_{DL}$ (=5V) and the signal $\phi_G$ applied to the gate electrode 3 to the low level $V_{GL}$ (=−5V). As a result, a depletion layer is formed in the channel region 4 so that the source region 1 and the drain region 5 are electrically cut off and the impact-ionization effect is also caused to disappear.

=Third Signal Mode=

Then, during the time interval between a time $t_3$ and a time $t_4$ the drive circuit 10 operates in the third signal mode. In this mode, the drive circuit 10 maintains the signal $\phi_D$ applied to the drain electrode 5a at the low level (=5V) and it also maintains the signal $\phi_G$ applied to the gate electrode 3 at the intermediary level (=−2V). When this occurs, the depletion layer in the channel region 4 disappears excluding the depletion layer Ld near the drain region 5 thus electrically connecting the source region 1 and the drain region 5. In this condition, the electrons from the source region 1 pass through the channel 4 and flow into the drain region 5 by way of the depletion layer Ld near to the drain region 5. At this time, the resistance value of the channel region 4 assumes a value corresponding to the amount of the charges accumulated in the gate region 2 and the well region 6 so that the amount of the electrons flowing into the drain region 5 through the channel region assumes a value amplified in accordance with the accumulated charges. In other words, at this time the electrons flowing into the drain region 5 are not the charges themselves generated by the photoelectric conversion but correspond to the secondary charges amplified in accordance therewith. In this way, the current flowing into the drain region 5 during the time interval from the time $t_3$ to the time $t_4$ is taken away as a signal output. Therefore, the time interval from the time $t_3$ to the time $t_4$ is a signal read-out period. At the time $t_4$, the signal $\phi_G$ applied to the gate electrode 3 is again lowered to the low level $V_{GL}$ (=−5V) by the drive circuit 10. As a result, a depletion layer is formed in the channel region 4 and the source region 1 and the drain region 5 are electrically cut off from each other.

=Fourth Signal Mode=

Then, during the time interval from a time $t_5$ to a time $t_6$ the drive circuit 10 performs the operation according to the fourth signal mode. In this mode, the drive circuit 10 maintains the signal $\phi_D$ applied to the drain electrode 5a at the low level $V_{DL}$ (=5V) and it also maintains the signal $\phi_G$ applied to the gate electrode 3 at its high level $V_{GH}$ (=0V). As a result, the accumulated charges remaining in the gate region 2 and the well region 6 are drained to the silicon substrate 7 so that they are recombined with the electrons in the silicon substrate 7 and are thus lost. At the time $t_6$, the signal $\phi_G$ is restored to the low level $V_{GL}$ and the device is restored to the initial condition. This fourth signal mode is an operation mode for resetting the photoelectric conversion device.

The signal current taken away from the drain electrode 5a during the time interval from the time $t_3$ to the time $t_4$ by the previously mentioned third signal mode was evaluated by a measuring apparatus with the result that it was confirmed that the signal current had a magnitude of about 10 times that of the conventional JFET photoelectric conversion device, and that the signal-to-noise ratio was improved to be about 5 times that of the conventional device even though it was affected by the amplification characteristic of the measuring apparatus.

It is to be noted that while one cycle of the sequential operations including the first signal mode to the fourth signal mode has been described in connection with the foregoing embodiment, it is needless to say that the present invention embraces a construction adapted to repeatedly perform such sequential operations. Further, while the foregoing embodiment shows by way of example the JFET photoelectric conversion device comprising the single photoelectric conversion section, the present invention can also be applied to an image sensor in which a plurality of picture elements composed of a plurality of photoelectric conversion sections of the same construction are arranged one-dimensionally or two-dimensionally and such a case also comes within the scope of the present invention.

What is claimed is:

1. An amplification-type photoelectric conversion device utilizing a junction field-effect transistor comprising:

an n-type silicon semiconductor substrate;

a p-type well region provided on a first principal surface side of said semiconductor substrate to form a p-n junction photoelectric conversion section within said semiconductor substrate;

an n-type source region formed in said well region;

an n-type drain region formed in said well region;

a p-type gate region formed between said source region and said drain region on said first principal surface side in said well region;

an n-type channel region formed between said source region and said drain region in said well region just below said gate region;

an insulating film formed on a surface of said gate region exposed on said first principal surface;

a gate electrode arranged to face said gate region through said insulating film; and a drive circuit for applying driving signals to said source region, said drain region and said gate electrode, respectively;

said drive circuit having a first signal mode for accumulating charges generated by an incident light on said photoelectric conversion section, a second signal mode for causing a flow of current between said source region and said drain region and raising a potential difference between said source region and said drain region to a high level so as to cause an impact-ionization effect in accordance with an amount of the charges accumulated in said first signal mode and thereby to accumulate charges generated by said effect, and a third signal mode for causing the flow of current between said source region and said drain region and lowering the potential difference between said source region and said drain region to a low level so as to deliver from said drain region secondary charges corresponding to a total amount of the chares accumulated by said first signal mode and the charges accumulated by said second signal mode.

2. A photoelectric conversion device according to claim 1, wherein impurity diffusion concentrations of said n-type source region and said n-type drain region are higher than that of said n-type silicon semiconductor substrate.

3. A photoelectric conversion device according to claim 1, wherein said drive circuit further includes a fourth signal mode for causing extinction of all the charges accumulated by said first signal mode and said second signal mode after completion of said third signal mode.

4. A photoelectric conversion device according to claim 3, wherein said drive circuit repeatedly performs said first signal mode, said second signal mode, said third signal mode and said fourth signal mode in this order.

5. An amplification-type photoelectric conversion device utilizing a junction field-effect transistor comprising:

an n-type silicon semiconductor substrate having phosphorus diffused thereinto at a concentration of substantially $1*10^{15}/cm^3$;

a p-type well region provided on a first principal surface side of said semiconductor substrate so as to form a p-n junction photoelectric conversion section within said semiconductor substrate, said well region having boron diffused thereinto at a concentration of substantially $1*10^{16}/cm^3$;

an n-type source region formed in said well region and having phosphorus diffused thereinto at a concentration of substantially $1*10^{20}/cm^3$;

an n-type drain region formed in said well region and having phosphorus diffused thereinto at a concentration of substantially $1*10^{20}/cm^3$;

a p-type gate region formed between said source region and said drain region on the first principal surface side in said well region and having boron diffused thereinto at a concentration of substantially $1*10^{17}/cm^3$;

an n-type channel region formed between said source region and said drain region in said well region just below said gate region and having phosphorus diffused thereinto at a concentration of substantially $5*10^{16}/cm^3$;

an insulating film formed by an oxide film on a surface of said gate region exposed on said first principal surface;

a gate electrode of aluminum arranged to face said gate electrode through said insulating film; and a drive circuit for applying driving signals to said source region, said drain region and said gate electrode, respectively;

said drive circuit having:

a first signal mode whereby said source region is maintained at a ground potential, said drain region is maintained at a first potential which is more positive than said source region, and said gate region is maintained at a second potential which is more negative than said source region so as to accumulate charges generated by incident light on said photoelectric conversion section, a second signal mode whereby said source region is maintained at said ground potential, said drain region is maintained at a third potential which is more positive than said first potential, and said gate region is maintained at a fourth potential which is more negative than said source region and more positive than said second potential so as to cause a flow of current between said source region and said drain region and raise a potential difference between said source region and said drain region to a high level and thereby to cause an impact-ionization effect corresponding to an amount of the charges accumulated by said first signal mode and accumulate charges generated by said effect, and a third signal mode whereby said source region is maintained at said ground potential, said drain region is maintained at said first potential, and said gate region is maintained at said fourth potential so as to cause the flow of current between said source region and said drain region and lower the potential difference between said source region and said drain region to a low level and thereby to deliver secondary charges correponding to a total amount of the charges accumulated by said first signal mode and the charges accumulated by said second signal mode as a signal output from said drain region.

6. A photoelectric conversion device according to claim 5, wherein said drive circuit further includes a fourth signal mode whereby after the completion of said third signal mode, said source region is maintained at said ground potential, said drain region is maintained at said first potential, and said gate region is maintained substantially at said ground potential so as to cause extinction of all remaining charges accumulated by said first signal mode and said second signal mode.

7. A photoelectric conversion device according to claim 6, wherein said drive circuit repeatedly performs said first signal mode, said second signal mode, said third signal mode and said fourth signal mode in this order.

* * * * *